US006830972B2

(12) United States Patent
Coursey

(10) Patent No.: US 6,830,972 B2
(45) Date of Patent: Dec. 14, 2004

(54) METHOD OF FORMING MEMORY CIRCUITRY

(75) Inventor: Belford T. Coursey, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/241,243

(22) Filed: Sep. 10, 2002

(65) Prior Publication Data

US 2003/0015744 A1 Jan. 23, 2003

Related U.S. Application Data

(60) Continuation of application No. 09/810,595, filed on Mar. 15, 2001, which is a division of application No. 09/648,585, filed on Aug. 25, 2000, now Pat. No. 6,232,168.

(51) Int. Cl.$^7$ ......................................... H01L 21/8242
(52) U.S. Cl. ..................................................... 438/253
(58) Field of Search .............................. 438/243–256, 438/238–241, 396–397, 637–649, 626

(56) References Cited

U.S. PATENT DOCUMENTS

| 4,987,099 A | 1/1991 | Flanner ...................... 437/192 |
| 4,996,627 A | 2/1991 | Zias et al. ................ 361/283.4 |
| 5,023,683 A | 6/1991 | Yamada ...................... 357/23.6 |
| 5,032,882 A | 7/1991 | Okumura et al. .......... 357/23.6 |
| 5,061,650 A | 10/1991 | Dennison et al. ............. 437/47 |
| 5,084,414 A | 1/1992 | Manley et al. ............... 437/189 |

(List continued on next page.)

FOREIGN PATENT DOCUMENTS

| DE | 42 20 497 A1 | 6/1992 |
| DE | 43 16 503 A1 | 5/1993 |
| JP | 2-275665 | 11/1990 |
| JP | 3-174765 | 7/1991 |
| JP | 2528608 | 8/1996 |

OTHER PUBLICATIONS

IBM Corp., *Stacked Capacitor DRAM Cell With Vertical Fins (VF–STC)*, 33 IBM Technical Disclosure Bulletin, No. 2, pp. 245–247 (Jul. 1990).

Toru Kaga et al., *Crown–Shaped Stacked–Capacitor Cell for 1.5–V Operation 64–Mb DRAM's*, 38 IEEE Transactions on Electron Devices, No. 2, pp. 255–260 (Feb. 1991).

K. Ueno et al., *A Quarter–Micron Planarized Interconnection Technology With Self–Aligned Plug*, IEEE, pp. 305–308 (1992).

(List continued on next page.)

*Primary Examiner*—Craig A. Thompson
(74) *Attorney, Agent, or Firm*—Wells St. John P.S.

(57) ABSTRACT

A method of forming memory circuitry having a memory array having a plurality of memory capacitors and having peripheral memory circuitry operatively configured to write to and read from the memory array, includes forming a dielectric well forming layer over a semiconductor substrate. A portion of the well forming layer is removed effective to form at least one well within the well forming layer. An array of memory cell capacitors is formed within the well. The peripheral memory circuitry is formed laterally outward of the well forming layer memory array well. In one implementation, memory circuitry includes a semiconductor substrate. A plurality of word lines is received over the semiconductor substrate. An insulative layer is received over the word lines and the substrate. The insulative layer has at least one well formed therein. The well has a base received over the word lines. The well peripherally defines an outline of a memory array area. Area peripheral to the well includes memory peripheral circuitry area. A plurality of memory cell storage capacitors is received within the well over the word lines. Peripheral circuitry is received within the peripheral circuitry area and is operatively configured to write to and read from the memory array.

20 Claims, 6 Drawing Sheets

U.S. PATENT DOCUMENTS

| | | | |
|---|---|---|---|
| 5,087,591 A | 2/1992 | Teng | 437/225 |
| 5,120,679 A | 6/1992 | Boardman et al. | 437/195 |
| 5,138,412 A | 8/1992 | Hieda et al. | 357/23.6 |
| 5,168,073 A | 12/1992 | Gonzalez et al. | 437/47 |
| 5,206,183 A | 4/1993 | Dennison | 437/47 |
| 5,250,457 A | 10/1993 | Dennison | 437/48 |
| 5,770,499 A * | 6/1998 | Kwok et al. | 438/253 |
| 5,780,338 A * | 7/1998 | Jeng et al. | 438/253 |
| 5,990,021 A | 11/1999 | Prall et al. | 438/753 |
| 5,998,257 A | 12/1999 | Lane et al. | 438/253 |
| 6,030,879 A | 2/2000 | Huang | |
| 6,054,394 A | 4/2000 | Wang | 438/753 |
| 6,057,206 A | 5/2000 | Nguyen et al. | 438/401 |
| 6,087,261 A | 7/2000 | Nishikawa et al. | |
| 6,114,201 A * | 9/2000 | Wu | 438/254 |
| 6,130,126 A | 10/2000 | Iwakiri | 438/253 |
| 6,159,818 A | 12/2000 | Durcan et al. | 438/387 |
| 6,200,898 B1 | 3/2001 | Tu | 438/692 |
| 6,232,168 B1 | 5/2001 | Coursey | |
| 6,232,240 B1 | 5/2001 | Tung | 438/745 |
| 6,258,729 B1 | 7/2001 | DeBoer et al. | 438/745 |
| 6,376,380 B1 | 4/2002 | Tang et al. | |
| 6,395,600 B1 | 5/2002 | Durcan et al. | 348/253 |
| 6,426,243 B1 | 7/2002 | Coursey | 438/128 |
| 6,589,876 B1 | 7/2003 | Tran | 438/700 |

OTHER PUBLICATIONS

Y. Kawamoto et al., "A 1.28 symbols $\mu m^2$ Bit–Line Shielded Memory Cell Technology for 64Mb DRAMs", *Central Research Laboratory*, CH2874–6/90/0000–0013, 1990 Symposium on VLSI Technology, 1990 IEEE.

E. Fujii, et al., "OLSI DRAM Technology with $Ba_{0.7}Sr_{0.3}TiO_2$ Film of 1.3nm Equlvalent $SiO_2$ Thickness and $10^{-9}$ $A/cm^2$ Leakage Current", IEEE, 04/92, pps. 10.3.1–10.3.4.

* cited by examiner

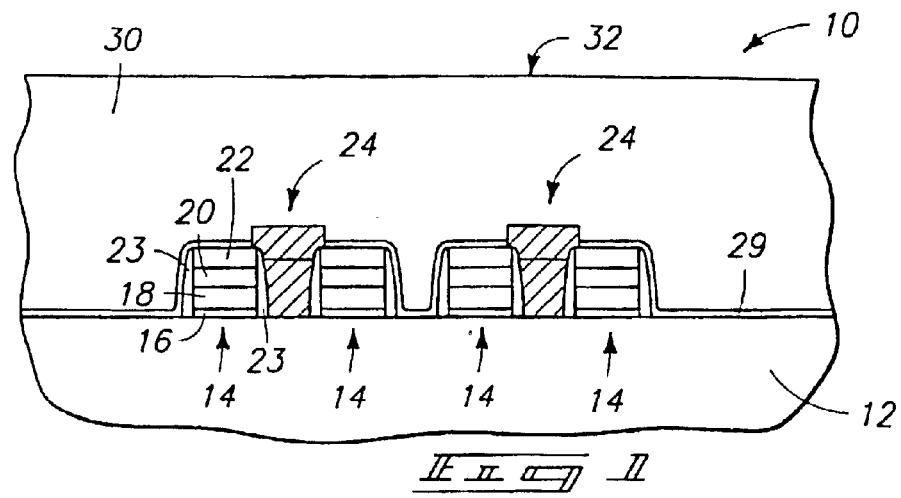
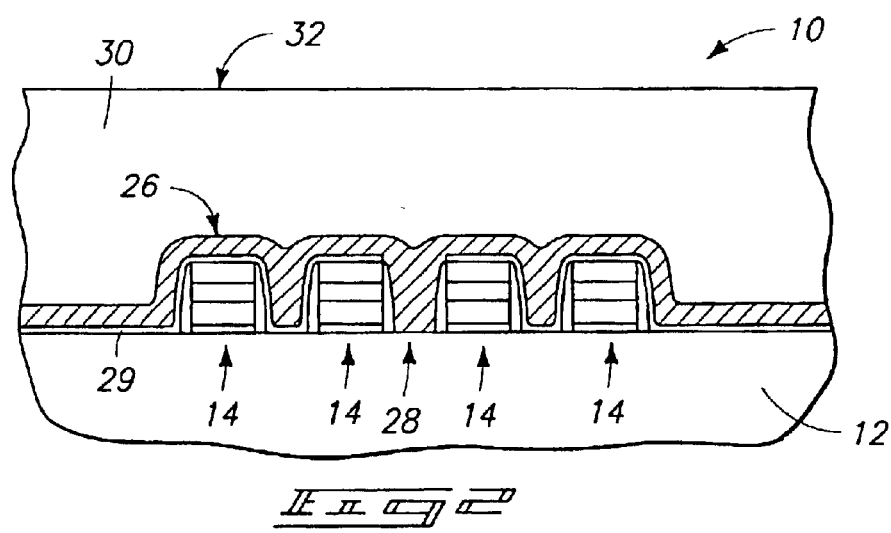
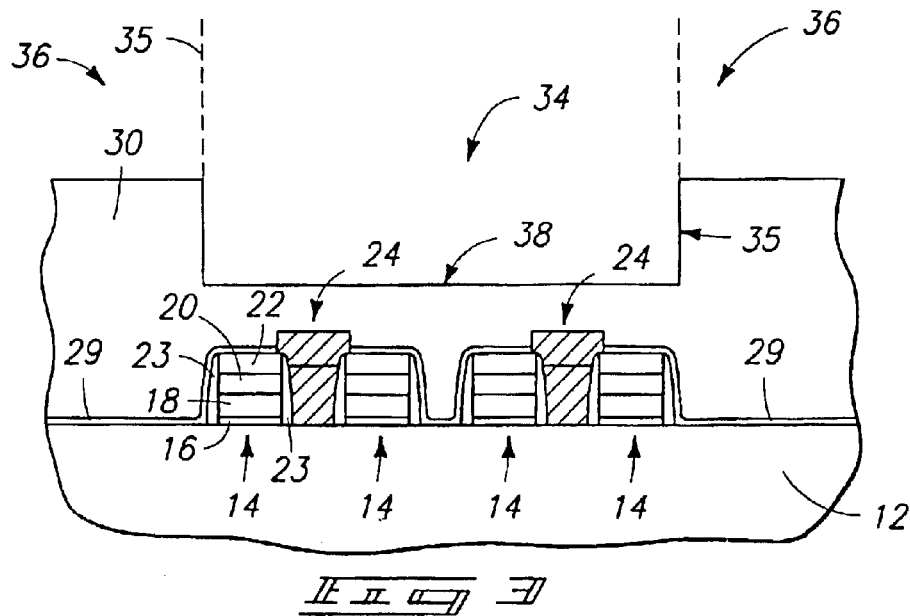

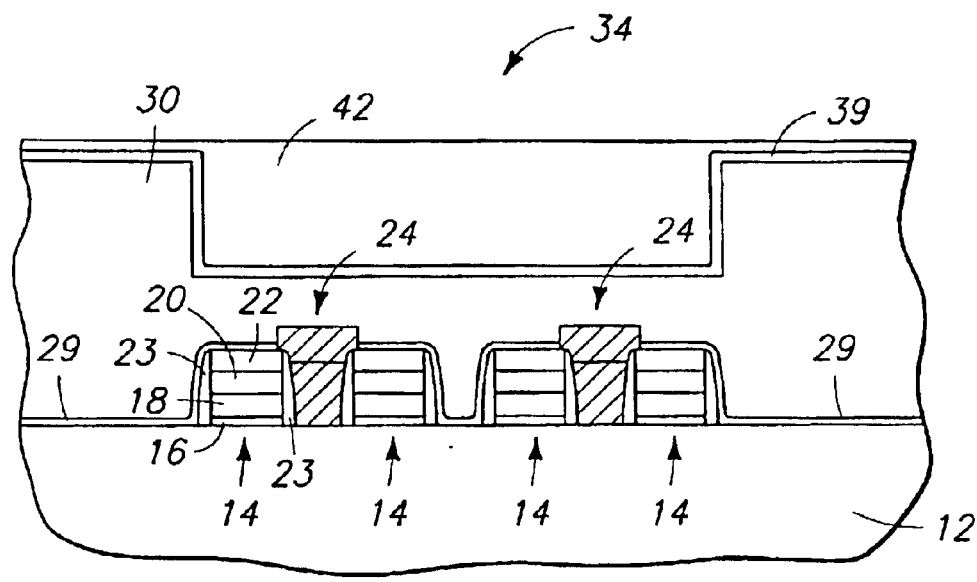
F I G 7
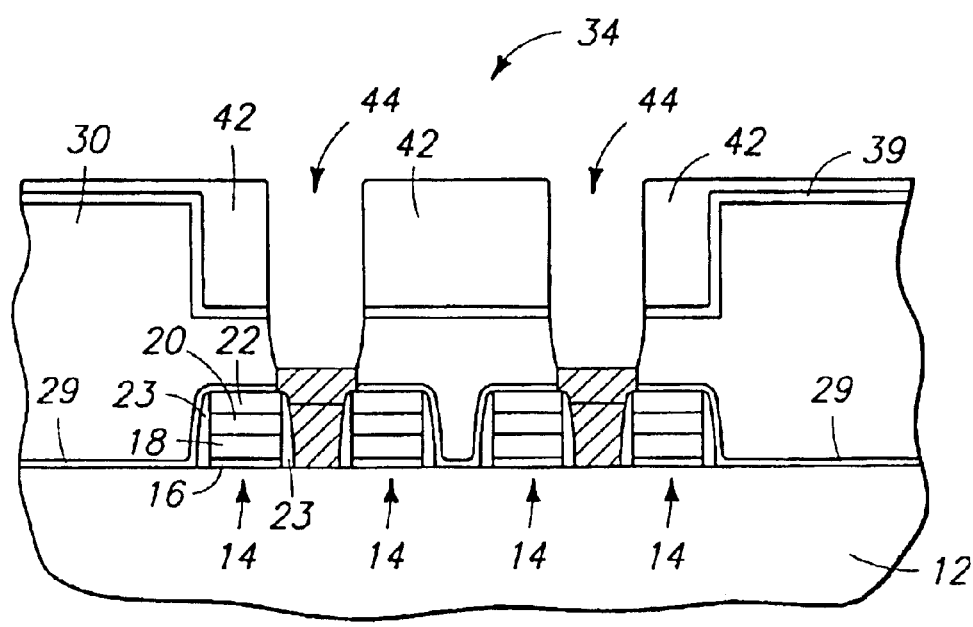
F I G 8

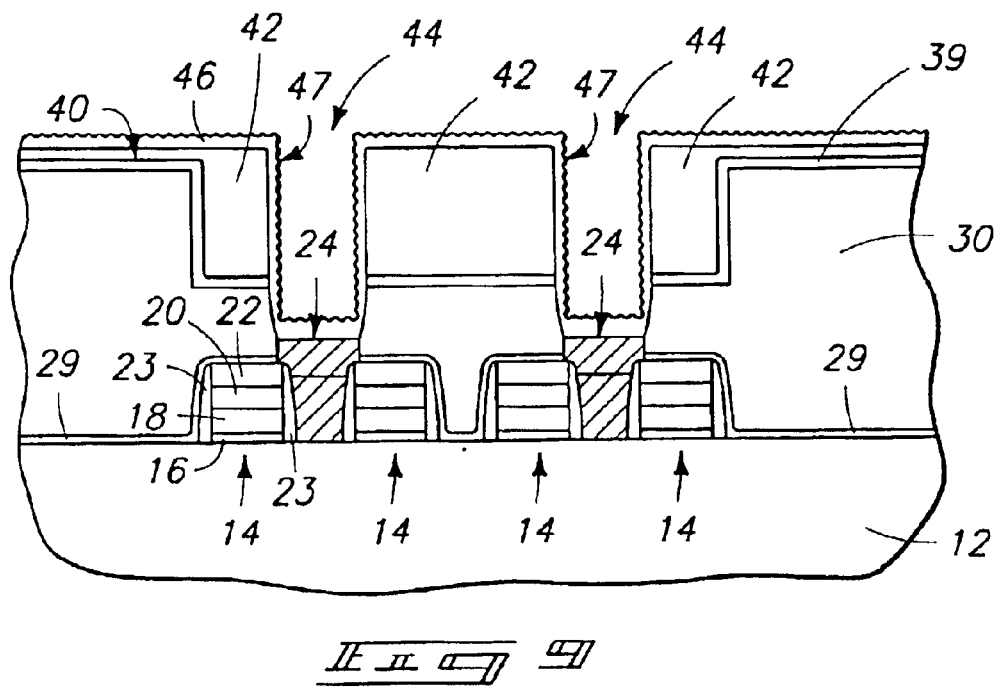
_FIG. 9_
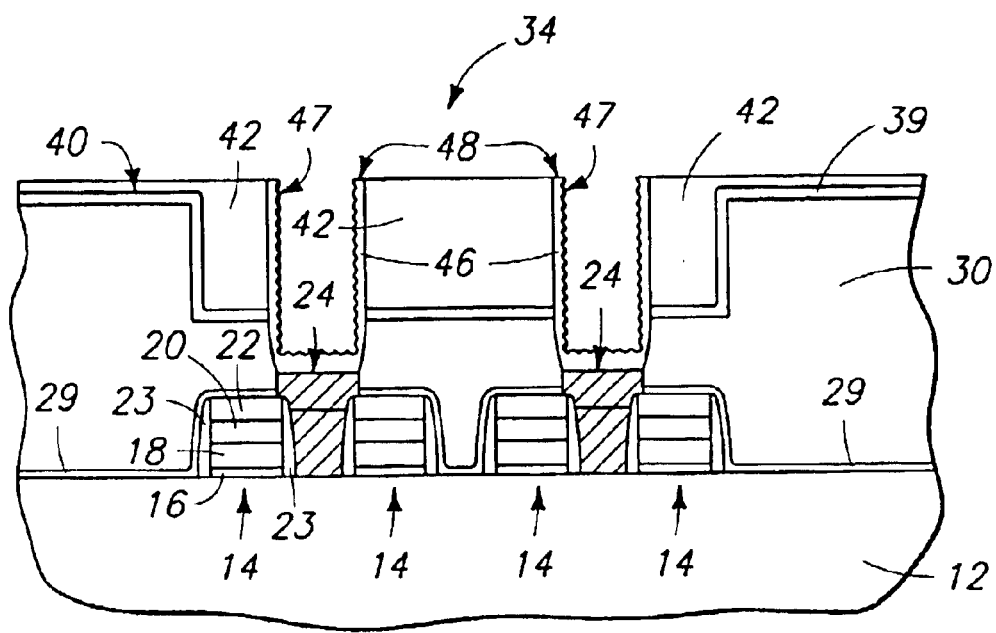
_FIG. 10_

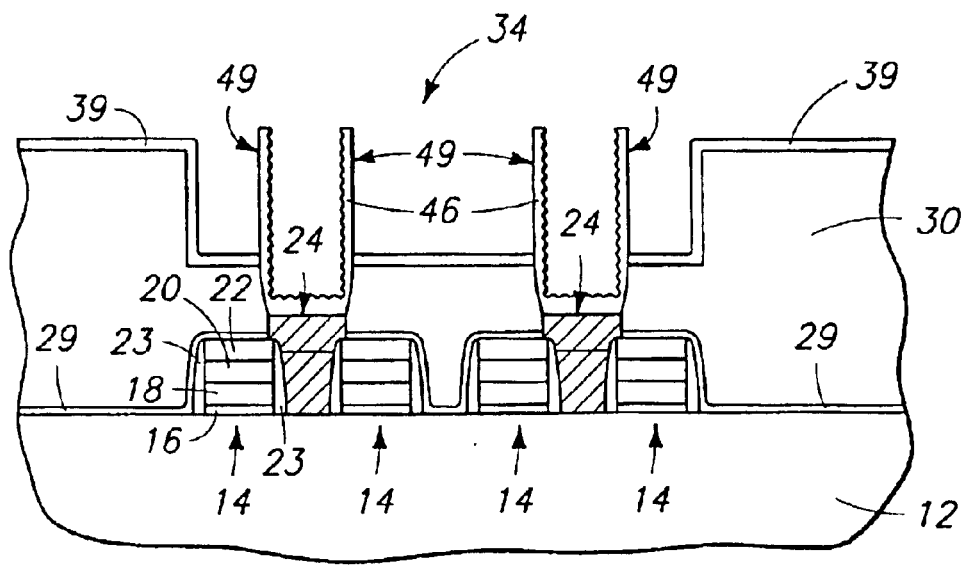
_FIG. 11_
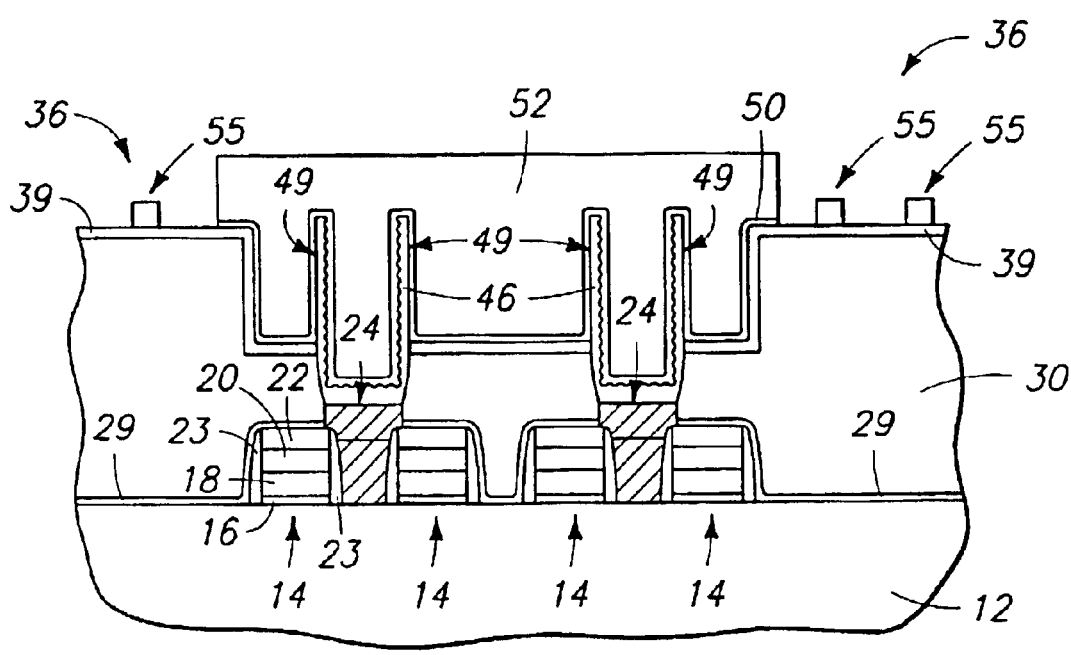
_FIG. 12_

METHOD OF FORMING MEMORY CIRCUITRY

CROSS REFERENCE TO RELATED APPLICATION

This application is a Continuation of U.S. patent application Ser. No. 09/810,595 which was filed on Mar. 15, 2001; which resulted from a divisional application of U.S. patent application Ser. No. 09/648,585, filed on Aug. 25, 2000, now U.S. Pat. No. 6,232,168 issued May 15, 2001, entitled "Method of Forming Memory Circuitry" (as amended), naming Belford T. Coursey as inventor, the disclosure of which is incorporated by reference.

TECHNICAL FIELD

This invention relates to memory circuitry and to methods of forming memory circuitry.

BACKGROUND OF THE INVENTION

Memory circuitry in semiconductor fabrication is formed to include an array area where individual memory cells are typically fabricated in a dense repeating pattern, and a peripheral area where peripheral circuitry which is operatively configured to write to and read from the memory array is fabricated. Peripheral circuitry and array circuitry are typically largely fabricated at the same time. Further the memory cell capacitors within the memory array are commonly fabricated to be vertically elongated, sometimes in the shape of cups or containers, in order to maximize the available surface area for individual capacitors for storage capacitance. The electronic components or devices of the peripheral circuitry are not typically as vertically elongated, thereby creating topography problems in the fabrication due to portions of the memory array circuitry being fabricated significantly elevationally higher than portions of the peripheral circuitry.

The invention was principally motivated in addressing or overcoming problems associated with this issue, and in the fabrication of capacitor-over-bit line dynamic random access memory circuitry. However, the invention is in no way so limited, and is applicable without limitation to these problems or objectives, with the invention only being limited by the accompanying claims appropriately interpreted in accordance with the doctrine of equivalents.

SUMMARY

The invention comprises memory circuitry and methods of forming memory circuitry. In but one implementation, a method of forming memory circuitry having a memory array having a plurality of memory capacitors and having peripheral memory circuitry operatively configured to write to and read from the memory array, includes forming a dielectric well forming layer over a semiconductor substrate. A portion of the well forming layer is removed effective to form at least one well within the well forming layer. An array of memory cell capacitors is formed within the well. The peripheral memory circuitry is formed laterally outward of the well forming layer memory array well.

In one implementation, a dielectric well forming layer is formed over a semiconductor substrate. A portion of the well forming layer is removed effective to form at least one well within the well forming layer. A capacitor storage node forming layer is formed within the well. An array of capacitor storage node openings is formed within the capacitor storage node forming layer within the well. Capacitor storage node electrodes are formed within the capacitor storage node forming layer openings. After forming the capacitor storage node electrodes, at least some of the capacitor storage node forming layer is removed from within the well. Peripheral memory circuitry is formed laterally outward of the well.

In one implementation, memory circuitry includes a semiconductor substrate. A plurality of word lines is received over the semiconductor substrate. An insulative layer is received over the word lines and the substrate. The insulative layer has at least one well formed therein. The well has a base received over the word lines. The well peripherally defines an outline of a memory array area. Area peripheral to the well includes memory peripheral circuitry area. A plurality of memory cell storage capacitors is received within the well over the word lines. Peripheral circuitry is received within the peripheral circuitry area and is operatively configured to write to and read from the memory array.

Other implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with an aspect of the invention.

FIG. 2 is a diagrammatic sectional view of the FIG. 1 semiconductor wafer fragment at the one processing step of FIG. 1 but taken through a different section of the wafer fragment.

FIG. 3 is a view of the FIG. 1 wafer fragment at a processing step subsequent to that depicted by FIG. 1.

FIG. 7 is a view of the FIG. 6 wafer fragment at a processing step subsequent to that depicted by FIG. 6.

FIG. 8 is a view of the FIG. 7 wafer fragment at a processing step subsequent to that depicted by FIG. 7.

FIG. 9 is a view of the FIG. 8 wafer fragment at a processing step subsequent to that depicted by FIG. 8.

FIG. 10 is a view of the FIG. 9 wafer fragment at a processing step subsequent to that depicted by FIG. 9.

FIG. 11 is a view of the FIG. 10 wafer fragment at a processing step subsequent to that depicted by FIG. 10.

FIG. 12 is a view of the FIG. 11 wafer fragment at a processing step subsequent to that depicted by FIG. 11.

DETAILED DESCRIPTION OF THE PREFERRED EMBODIMENTS

Figure 4:
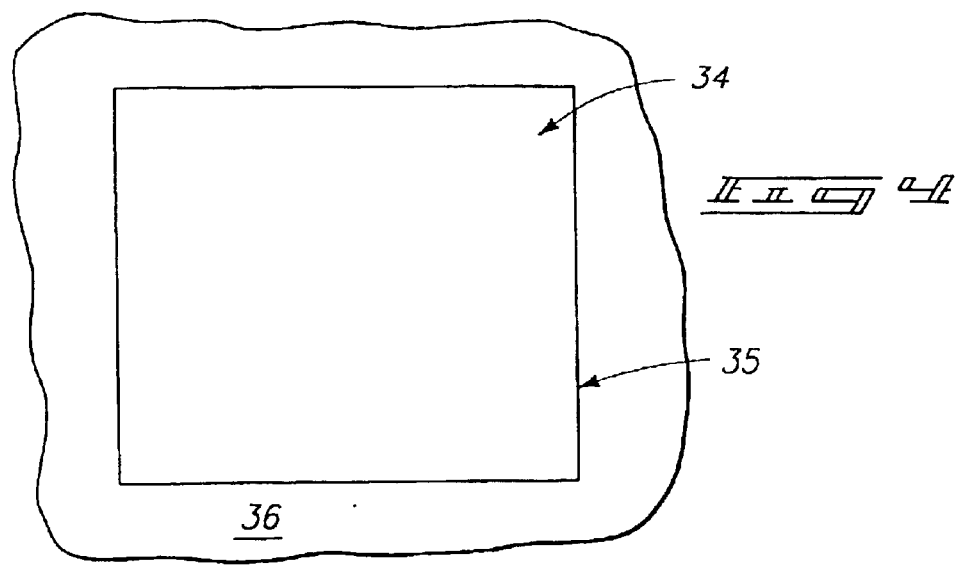
FIG. 4 is a top plan view of the FIG. 3 wafer fragment.

This disclosure of the invention is submitted in furtherance of the constitutional purposes of the U.S. Patent Laws "to promote the progress of science and useful arts" (Article 1, Section 8).

Referring initially to FIGS. 1 and 2, a semiconductor substrate in the form of a wafer fragment is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further in the context of this document, the term "layer" encompasses both the singular and the plural.

In only a preferred embodiment, dynamic random access memory circuitry is fabricated and described. Semiconductor wafer fragment 10 comprises a bulk monocrystalline substrate 12 having an array of word lines 14 formed thereover. Such are shown as comprising a gate oxide layer 16, an overlying conductively doped polysilicon layer 18, an overlying silicide layer 20, and an insulative cap 22. Anisotropically etched insulative sidewall spacers 23 are received about word lines 14. Capacitor storage node plugs 24 are received between the illustrated word lines, and constitute exemplary storage node contact locations as will be apparent from the continuing discussion. An array of digit lines 26 (FIG. 2) is formed over word lines 14. An insulative layer 29 is received between digit lines 26 and substrate 12, and exposes a digit line contact location 28 between the middle two illustrated word lines. An example material for layer 29 is undoped $SiO_2$ deposited by decomposition of tetraethylorthosilicate. An exemplary thickness is from about 300 Angstroms to about 500 Angstroms. Suitable source/drain constructions (not shown) would be provided relative to substrate 12 as is conventional, or as might be developed in later generation technologies.

A dielectric well forming layer 30 is formed over semiconductor substrate 12 over word lines 14 and bit lines 26. An example preferred material includes doped silicon dioxide, such as borophosphosilicate glass (BPSG) deposited to an exemplary thickness range of from about 10,000 Angstroms to about 30,000 Angstroms, and is preferably composed to consist essentially of a doped silicon dioxide. Preferably, as shown, such comprises an outer planar surface 32.

Referring to FIGS. 3 and 4, a portion of dielectric/insulative well forming layer 30 is removed to form at least one well 34 within well forming layer 30. Such patterning and removal most preferably occurs by photolithography whereby the area outside of well portion 34 is masked with photoresist, and a timed etched is preferably then conducted of layer 30 using a chemistry substantially selective to not remove the photoresist to form the illustrated well 34. Well 34 includes a periphery 35, which peripherally defines an outline of a memory array area and an area 36 peripheral and laterally outward of well 34 which comprises memory peripheral circuitry area. Well 34 also includes a base 38 which, in the preferred illustrated embodiment, is substantially planar. The etch to produce the illustrated well 34 is preferably timed to provide a lowestmost portion 38 thereof which is received above word line caps 22 by at least 2000 Angstroms. Further, lowestmost portion 38 is preferably received above outermost tops of digit lines 26 by at least 1000 Angstroms and preferably less than 4000 Angstroms. A more preferred distance between base 38 and the outermost tops of the digit lines is from about 2500 Angstroms to about 3500 Angstroms, with 3000 Angstroms being a specific preferred distance.

Figure 5:
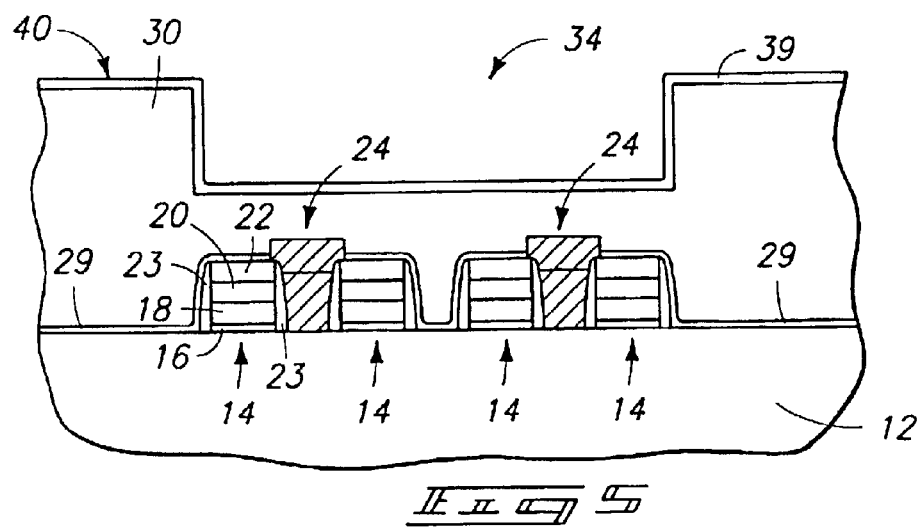
FIG. 5 is a view of the FIG. 3 wafer fragment at a processing step subsequent to that depicted by FIG. 3.

Referring to FIG. 5, an etch stop layer 39 (preferably dielectric) is preferably deposited over well forming layer 30 outward of and to within well 34 to less than completely fill well 34. An exemplary and preferred material for layer 39 is silicon nitride, with an exemplary preferred deposition thickness being from about 40 Angstroms to about 125 Angstroms, with from about 50 Angstroms to 70 Angstroms being more preferred. Such provides an insulative layer 39/30 outermost surface 40 which, in the illustrated and preferred embodiment, is substantially planar laterally outside of well 34.

Figure 6:
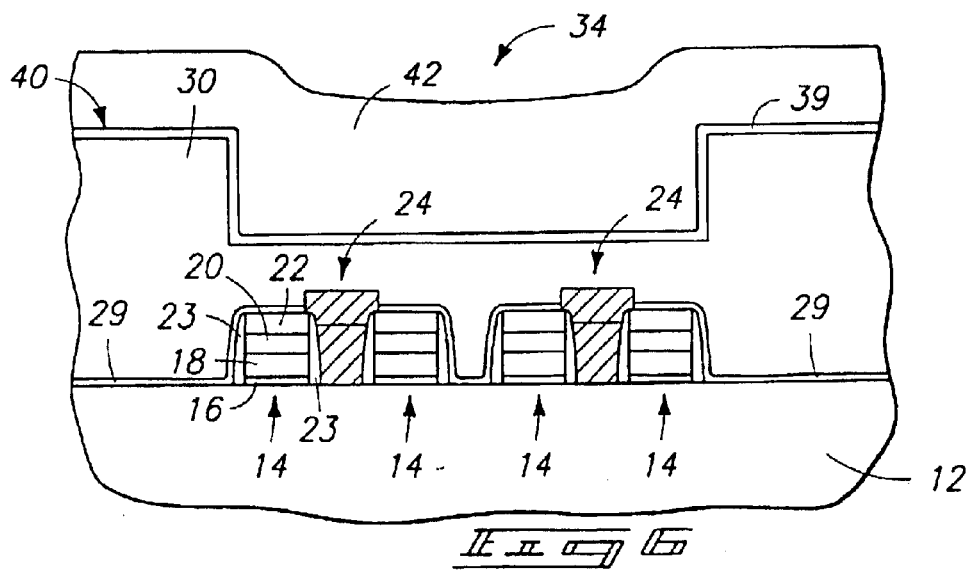
FIG. 6 is a view of the FIG. 5 wafer fragment at a processing step subsequent to that depicted by FIG. 5.

Referring to FIG. 6, a storage node forming layer 42 is formed over etch stop layer 39 laterally outward of and to within well 34 to overfill well 34. Layer 42 preferably comprises a dielectric material, with BPSG being but one example. In the depicted embodiment, storage node forming layer 42 is initially formed to be substantially non-planar.

Referring to FIG. 7, storage node forming layer 42 is planarized. Preferably, the planarization is such to be effective to leave etch stop layer 39 covered by storage node forming layer 42 of a thickness of at least about 1,000 Angstroms outside of well 34. Planarization might occur by resist-etch back, chemical-mechanical polishing, or any other existing or yet-to-be-developed planarizing technique.

Referring to FIG. 8, an array of capacitor storage node openings 44 is formed through storage node forming layer 42, through etch stop layer 39, and into well forming layer 30 through well base 38 within well 34. Storage node openings 44 are formed over storage node contact locations/plugs 24.

Referring to FIG. 9, a capacitor storage node layer 46 (preferably hemispherical grain polysilicon, HSG) is formed preferably be chemical vapor depositing over storage node forming layer 42 to within capacitor storage node openings 44 to less than completely fill such openings.

Referring to FIG. 10, capacitor storage node layer material 46 has been removed outwardly of storage node forming layer 42 effective to form an array of storage node capacitor electrodes 47 in electrical connection with storage node contact locations/plugs 24. In the illustrated and preferred embodiment, storage node capacitor electrodes 47 comprise a portion which has a container shape, with the portion being formed to be partially received within well forming layer 30 through the base openings within well 34. Non-container capacitor electrode constructions are also of course contemplated. Removal can occur by any of a number of techniques, with chemical-mechanical polishing being preferred. Capacitor storage node containers 47 have topmost surfaces 48 which, in the preferred embodiment, are received elevationally proximate outermost surface 40 of insulative layer 39/30. In the context of this document, "elevationally proximate" means elevationally within 50 Angstroms. In the illustrated and preferred embodiment, topmost surfaces 48 are received elevationally above substantially planar outermost surface 40 by less than 50 Angstroms. In preferred embodiments, exactly elevationally coincident or elevationally below are also contemplated, although not as preferred as that depicted in the drawings.

Referring to FIG. 11, at least some of capacitor storage node forming layer 42 is removed from within well 34. Preferably, such removal occurs by chemical etching using a chemistry which is substantially selective to remove capacitor storage node forming layer 42 relative to etch stop layer 39, and as well exposes lateral outer container surface area 49 of capacitor containers 47. As illustrated and preferred, substantially all of capacitor storage node forming layer 42 is shown as having been etched from the substrate using dielectric etch stop layer 39 as an etch stop. Where layer 42 comprises BPSG and layer 39 comprises silicon nitride, an exemplary chemistry is dilute HF at a 10:1 volume ratio.

Referring to FIG. 12, a capacitor dielectric layer 50 and a capacitor cell electrode layer 52 are formed over capacitor storage node containers 47, including outer surface area 49.

Such provides but one example of forming an array of memory cell capacitors within well 34 over word lines 14 and digit lines 26. Peripheral circuitry 55 is formed within peripheral circuit area 36 and is operatively designed and configured to write to and read from the memory array, as is conventional or as yet-to-be-developed. Exemplary existing peripheral dynamic random access memory circuitry includes sense amplifier elements, equilibration and bias circuits, isolation devices, input/output transistors, etc. Exemplary devices 55 are shown only diagrammatically, as the peripheral circuitry placement, not the actual circuitry itself, is only what is germane to aspects of this invention.

Figure 13:
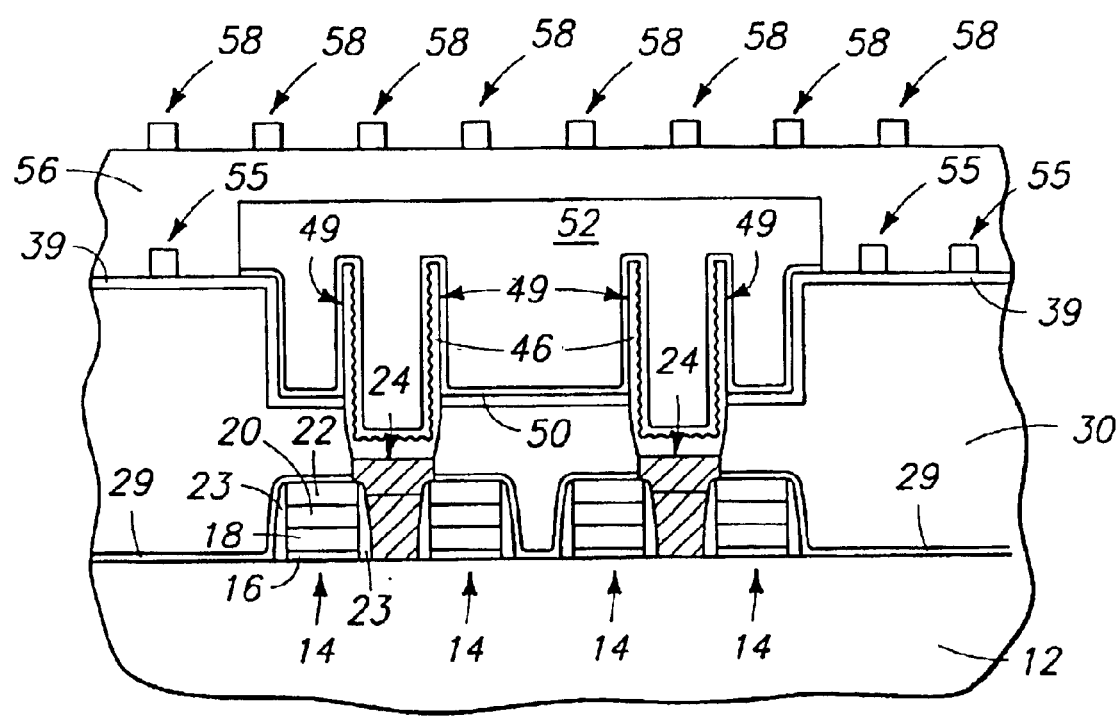
FIG. 13 is a view of the FIG. 12 wafer fragment at a processing step subsequent to that depicted by FIG. 12.

Referring to FIG. 13, a planarized dielectric layer 56 and exemplary metal line/wiring components 58 are shown as being fabricated.

The illustrated exemplary embodiment, by way of example only and in no way by way of limitation, effectively elevationally recesses the memory array and thereby the vertically elongated memory array capacitors compared to the memory peripheral circuitry area. The outer surface of insulative layer 39/30 thereby provides a base which is preferably elevationally proximate or coincident with the tops of the storage nodes of the memory cell capacitors upon or through which the peripheral circuitry can be fabricated.

Further, the illustrated exemplary embodiment, by way of example only and not by way of limitation, also facilitates prevention of an existing processing problem known as oxidation punch-through. Punch-through results from oxygen penetration into lower substrate areas during wafer fabrication and undesired oxidation of underlying conductive components. Prior art capacitor fabrication methods have typically contended with punch-through by the silicon nitride barrier function of the capacitor dielectric material which typically comprises at least part of the capacitor dielectric layer. The nitride serves as a barrier to oxygen diffusion in subsequent steps which can undesirably form insulative oxides on circuitry material. Yet existing designs continue to push the effective thickness of the capacitor dielectric silicon nitride layer ever thinner such that suitable nucleation all over the wafer and barrier properties typically will not occur. In the illustrated preferred embodiment, etch stop layer 39 is ideally fabricated of a diffusion barrier material, such as silicon nitride, and can be deposited to a suitable thickness (i.e., at least 50 Angstroms) to desirably form both an etch stop barrier layer function and an oxygen diffusion barrier layer during circuitry fabrication.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming memory circuitry comprising a memory array having a plurality of memory capacitors and comprising peripheral memory circuitry operatively configured to write to and read from the memory array, comprising:

forming a dielectric well forming layer over a semiconductor substrate;

removing a portion of the well forming layer effective to form at least one well within the well forming layer, the well having a well base;

forming an array of capacitor storage node openings through the well base into the well forming layer over storage node contact locations;

supporting an array of storage node capacitor electrodes within the well and base openings therein by the well forming layer, the capacitor storage node electrodes respectively comprising a portion which has a container shape, the container shape portion being formed to be received only partially within the capacitor storage node openings of the well forming layer through and beneath the well base; and forming the peripheral memory circuitry laterally outward of the well forming layer memory array well.

2. The method of claim 1 wherein the well base is substantially planar.

3. The method of claim 1 wherein the semiconductor substrate comprises word lines having insulative caps, the removing leaving a lowest portion of the well base at least 2000 Angstroms above the caps.

4. A method of forming memory circuitry comprising a memory array having a plurality of memory capacitors and comprising peripheral memory circuitry operatively configured to write to and read from the memory array, comprising:

forming a dielectric well forming layer over a semiconductor substrate;

removing a portion of the well forming layer effective to form at least one well within the well forming layer;

forming a capacitor storage node forming layer within the well;

forming an array of capacitor storage node openings within the capacitor storage node forming layer within the well;

forming capacitor storage node electrodes within the capacitor storage node forming layer openings, the capacitor storage node electrodes respectively comprising a portion which has a container shape, the container shape portion being formed to be received only partially within the capacitor storage node openings of the well forming layer through and beneath the well base;

after forming the capacitor storage node electrodes, removing at least some of the capacitor storage node forming layer from within the well; and forming the peripheral memory circuitry laterally outward of the well.

5. The method of claim 4, comprising forming an etch stop layer within the well prior to forming the capacitor storage node forming layer, the removing of at least some of the capacitor storage node forming layer comprising etching using a chemistry which is substantially selective to remove the capacitor storage node forming layer relative to the etch stop layer.

6. The method of claim 4 wherein the well forming layer is substantially planar.

7. The method of claim 4 wherein the semiconductor substrate comprises word lines having insulative caps and the well has a well base, the removing leaving a lowest portion of the well base at least 2000 Angstroms above the caps.

8. The method of claim 4 comprising removing substantially all of the capacitor storage node forming layer from within the well after forming the capacitor storage node electrodes.

9. A method of forming dynamic random access memory circuitry comprising:

forming an array of word lines over a semiconductive substrate;

forming a substantially planar dielectric well forming layer over the word lines;

etching at least one well into the well forming layer which defines a dynamic random access memory array area within the well and dynamic random access peripheral circuitry area laterally outward of well, the well having a substantially planar base;

depositing a dielectric etch stop layer over the well forming layer laterally outward of and to within the well to less than completely fill the well;

forming a dielectric storage node forming layer over the etch stop layer laterally outward of and to within the well to overfill the well;

etching an array of capacitor storage node openings within the well through the storage node forming layer, through the etch stop layer and into the well forming layer over storage node contact locations;

depositing a capacitor storage node layer over the storage node forming layer to within the capacitor storage node openings to less than completely fill the capacitor storage node openings;

removing the capacitor storage node layer from outwardly of the storage node forming layer effective to form capacitor storage node containers within the capacitor storage node openings in electrical connection with the storage node contact locations, the capacitor storage node containers having top surfaces received elevationally proximate an outermost surface of the dielectric etch stop layer, the capacitor storage node containers respectively comprising a portion which has a container shape, the container shape portion being formed to be received only partially within the capacitor storage node openings of the well forming layer through and beneath the well base;

after forming the capacitor storage node containers, etching the capacitor storage node forming layer using the dielectric etch stop layer as an etch stop and exposing lateral outer container surface area of the capacitor containers;

forming a capacitor dielectric layer and a cell electrode layer over the capacitor storage node containers including the outer container surface area of the capacitor containers; and forming the dynamic random access peripheral memory circuitry laterally outward of the well.

10. The method of claim 9 comprising forming the capacitor storage node containers to have the top surfaces received elevationally above the outermost surface of the dielectric etch stop layer by less than 50 Angstroms.

11. The method of claim 9 wherein the dielectric storage node forming layer is initially formed to be non-planar, and further comprising planarizing the dielectric storage node forming layer prior to etching the array of capacitor storage node openings.

12. The method of claim 9 comprising etching substantially all of the capacitor storage node forming layer from the substrate after forming the capacitor storage node electrodes and before forming the capacitor dielectric layer.

13. A method of forming dynamic random access memory circuitry comprising:

forming an array of word lines over a semiconductive substrate;

forming an array of digit lines over the word lines;

forming a substantially planar dielectric well forming layer over the word lines and digit lines;

etching at least one well into the well forming layer which defines a dynamic random access memory array area within the well and dynamic random access peripheral circuitry area laterally outward of well, the well having a substantially planar base;

depositing a dielectric etch stop layer over the well forming layer laterally outward of and to within the well to less than completely fill the well;

forming a dielectric storage node forming layer over the etch stop layer laterally outward of and to within the well to overfill the well;

planarizing the storage node forming layer while effectively leaving the etch stop layer covered by the storage node forming layer;

etching an array of capacitor storage node openings within the well through the storage node forming layer, through the etch stop layer and into the well forming layer over storage node contact locations;

depositing a capacitor storage node layer over the storage node forming layer to within the capacitor storage node openings to less than completely fill the capacitor storage node openings;

removing the capacitor storage node layer from outwardly of the storage node forming layer effective to form capacitor storage node containers within the capacitor storage node openings in electrical connection with the storage node contact locations, the capacitor storage node containers having top surfaces received elevationally proximate an outermost surface of the dielectric etch stop layer, the capacitor storage node containers respectively comprising a portion which has a container shape, the container shape portion being formed to be received only partially within the capacitor storage node openings of the well forming layer through and beneath the well base;

after forming the capacitor storage node containers, etching substantially all of the capacitor storage node forming layer from the substrate using the dielectric etch stop layer as an etch stop and exposing lateral outer container surface area of the capacitor containers;

forming a capacitor dielectric layer and a cell electrode layer over the capacitor storage node containers including the outer container surface area of the capacitor containers; and forming the dynamic random access peripheral memory circuitry laterally outward of the well.

14. The method of claim 13 wherein the well forming layer consists essentially of doped silicon dioxide.

15. The method of claim 13 wherein the well etching leaves the well base at least 1000 Angstroms above outermost tops of the digit lines.

16. The method of claim 13 comprising forming the capacitor storage node containers to have the top surfaces received elevationally above the outermost surface of the dielectric etch stop layer by less than 50 Angstroms.

17. The method of claim 1 wherein the semiconductor substrate comprises bulk monocrystalline material.

18. The method of claim 4 wherein the semiconductor substrate comprises bulk monocrystalline material.

19. The method of claim 9 wherein the semiconductor substrate comprises bulk monocrystalline material.

20. The method of claim 13 wherein the semiconductor substrate comprises bulk monocrystalline material.

* * * * *

UNITED STATES PATENT AND TRADEMARK OFFICE
CERTIFICATE OF CORRECTION

PATENT NO. : 6,830,972 B2
DATED : December 14, 2004
INVENTOR(S) : Coursey

It is certified that error appears in the above-identified patent and that said Letters Patent is hereby corrected as shown below:

<u>Column 4,</u>
Line 32, please delete "be" after "preferably" and insert -- by --.

Signed and Sealed this

Ninth Day of August, 2005

JON W. DUDAS
*Director of the United States Patent and Trademark Office*